US007263651B2

(12) United States Patent
Xia et al.

(10) Patent No.: US 7,263,651 B2
(45) Date of Patent: Aug. 28, 2007

(54) METHOD AND APPARATUS FOR VARYING LENGTHS OF LOW DENSITY PARTY CHECK CODEWORDS

(75) Inventors: Bo Xia, Chandler, AZ (US); Eric A. Jacobsen, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 10/815,311

(22) Filed: Mar. 31, 2004

(65) Prior Publication Data

US 2005/0154958 A1 Jul. 14, 2005

Related U.S. Application Data

(60) Provisional application No. 60/536,071, filed on Jan. 12, 2004.

(51) Int. Cl.
H03M 13/13 (2006.01)
H03M 13/35 (2006.01)
(52) U.S. Cl. ..................................... 714/774
(58) Field of Classification Search ............... 714/774
See application file for complete search history.

(56) References Cited

U.S. PATENT DOCUMENTS

| 6,141,788 | A * | 10/2000 | Rosenberg et al. | 714/774 |
|---|---|---|---|---|
| 6,260,168 | B1 * | 7/2001 | Godoroja | 714/752 |
| 6,331,978 | B1 * | 12/2001 | Ravikanth et al. | 370/392 |
| 6,477,669 | B1 * | 11/2002 | Agarwal et al. | 714/708 |
| 6,553,534 | B2 * | 4/2003 | Yonge et al. | 714/774 |
| 6,567,465 | B2 * | 5/2003 | Goldstein et al. | 375/222 |
| 6,633,856 | B2 * | 10/2003 | Richardson et al. | 706/15 |
| 6,785,863 | B2 * | 8/2004 | Blankenship et al. | 714/799 |
| 6,807,648 | B1 * | 10/2004 | Cansever et al. | 714/776 |
| 6,829,308 | B2 * | 12/2004 | Eroz et al. | 375/271 |
| 6,895,547 | B2 * | 5/2005 | Eleftheriou et al. | 714/801 |
| 6,928,047 | B1 * | 8/2005 | Xia | 375/222 |
| 6,950,461 | B2 * | 9/2005 | Goldstein et al. | 375/222 |

(Continued)

FOREIGN PATENT DOCUMENTS

WO  WO 01/97387  12/2001

(Continued)

OTHER PUBLICATIONS

Kou et al—Low-density parity-check codes based on finite geometries: a rediscovery and new results IEEE Transations on Information Theory vol. 47, No. 7 Nov. 2001, pp. 2711-2736.

(Continued)

Primary Examiner—Stephen M. Baker
(74) Attorney, Agent, or Firm—Pearl Cohen Zedek Latzer, LLP

(57) ABSTRACT

A method and apparatus for encoding/decoding information using low density parity check (LDPC) codewords of varying lengths. In one implementation, an encoder/decoder uses a parity check matrix having a size that corresponds to a length of information for each codeword. In one example, the size of the parity check matrix may be retrieved from multiple stored matrices having different sizes. In other examples, a mother code matrix may be dynamically adjusted by puncturing parity bits and/or deleting information bits. Other inventive embodiments and adaptations are also disclosed.

22 Claims, 5 Drawing Sheets

U.S. PATENT DOCUMENTS

| | | | |
|---|---|---|---|
| 7,000,174 B2 * | 2/2006 | Mantha et al. | 714/790 |
| 7,058,141 B1 * | 6/2006 | Nedic | 375/341 |
| 7,103,818 B2 * | 9/2006 | Yedidia et al. | 714/752 |
| 2002/0042899 A1 * | 4/2002 | Tzannes et al. | 714/786 |
| 2002/0101915 A1 * | 8/2002 | Zhang et al. | 375/222 |
| 2002/0150167 A1 * | 10/2002 | Demjanenko et al. | 375/259 |
| 2004/0047433 A1 * | 3/2004 | Mogre et al. | 375/308 |
| 2004/0098659 A1 * | 5/2004 | Bjerke et al. | 714/776 |
| 2004/0260988 A1 * | 12/2004 | Kobayashi | 714/719 |
| 2004/0268205 A1 * | 12/2004 | Stolpman | 714/758 |

FOREIGN PATENT DOCUMENTS

| | | |
|---|---|---|
| WO | WO 2004/047307 | 6/2004 |

OTHER PUBLICATIONS

Eleftheriou et al—Low-density parity-check codes for digital subscriber lines—ICC 2002. 2002 IEEE International conference on communications. Cojnference proceedings. Apr. 28-May 2, 2002 vol. 1 of 5 pp. 1752-1757.

Wilson—Linear Block Codes—Digital Modulation and Coding, XX, XX. 1996, pp. 411-425, 470.

Lu et al—LDPC-Based space-time coded OFDM systems over correlated fading channels: performance analysis and receiver design—IEEE Transactions on Communications vol. 50, No. 1—Jan. 2002—pp. 74-88.

Gallager—Low-density parity-check codes—IRE Transactions on information theory—Jan. 1962, pp. 21-28.

* cited by examiner

METHOD AND APPARATUS FOR VARYING LENGTHS OF LOW DENSITY PARTY CHECK CODEWORDS

CROSS-REFERENCE TO RELATED APPLICATIONS

This application claims benefit of priority under 35 U.S.C. § 119(e) to U.S. application Ser. No. 60/536,071, which was filed on Jan. 12, 2004.

BACKGROUND OF THE INVENTION

Most communications networks are designed to convey multiple communications simultaneously over each individual communication path, for example, a radio frequency (RF) channel or physical connection, using some type of modulation. In recent years, an increasing demand has arisen for efficient and reliable digital data transfers which assure correct data transmissions at as great a data rate as possible. Forward error correction (FEC) codes have been used in some communications systems for this purpose.

Codes are essentially digital data sequences derived from message sequences and used to convey message information. In forward error correction (FEC), information may be encoded to provide the abilities of detection and/or correction of errors occurring in a transmission, for example resulting from a noisy channel. The receiver in a communication system can recover all the information in the codewords by itself and thus coding lends advantages to high speed communication systems and/or those requiring synchronous communications.

Low Density Parity Check (LDPC) codes are a type of FEC block codes which are constructed using a number of simple parity-check relationships shared between the bits in a codeword. An LDPC code (n, k) where n is codeword length and k is the information length, is usually represented by a sparse parity-check matrix H with dimension n*(n–k). The parity check matrix is used as a basis for encoding and decoding LDPC codewords. LDPC codes are well known for their excellent performance in communications systems but due to their block nature, they have thus far not been flexible enough for systems where either information length or codeword length (or both) is variable. Thus a more flexible LDPC coding scheme is desirable.

BRIEF DESCRIPTION OF THE DRAWING

Aspects, features and advantages of the present invention will become apparent from the following description of the invention in reference to the appended drawing in which like numerals denote like elements and in which.

DETAILED DESCRIPTION OF THE INVENTION

While the following detailed description may describe example embodiments of the present invention in relation to wireless networks, the embodiments of present invention are not limited thereto and, for example, can be implemented using wired systems such as Ethernet or Token ring networks and/or optical networks where suitably applicable.

The following inventive embodiments may be used in a variety of applications including transmitters, receivers and/or transceivers of a radio system, although the present invention is not limited in this respect. Radio systems specifically included within the scope of the present invention include, but are not limited to: wireless local area network (WLAN) systems, wireless metropolitan area network (WMAN) systems and wireless wide area network (WWAN) systems. Related network devices and peripherals such as network interface cards (NICs) and other network adaptors, base stations, access points (APs), gateways, bridges, hubs and cellular radiotelephones are also included. Further, the network systems within the scope of the invention may include cellular radiotelephone systems, satellite systems, personal communication systems (PCS), two-way radio systems, one-way pages, two-way pagers, personal computers (PC), personal digital assistants (PDA), personal computing accessories (PCA) and all future arising systems which may be related in nature and to which the principles of the invention could be suitably applied.

An LDPC code is a message encoding technique defined by a sparse parity check matrix. The message to be sent is encoded using a generator matrix or the sparse parity check matrix and when it reaches its destination, it is decoded using a related sparse parity check matrix.

Figure 1:
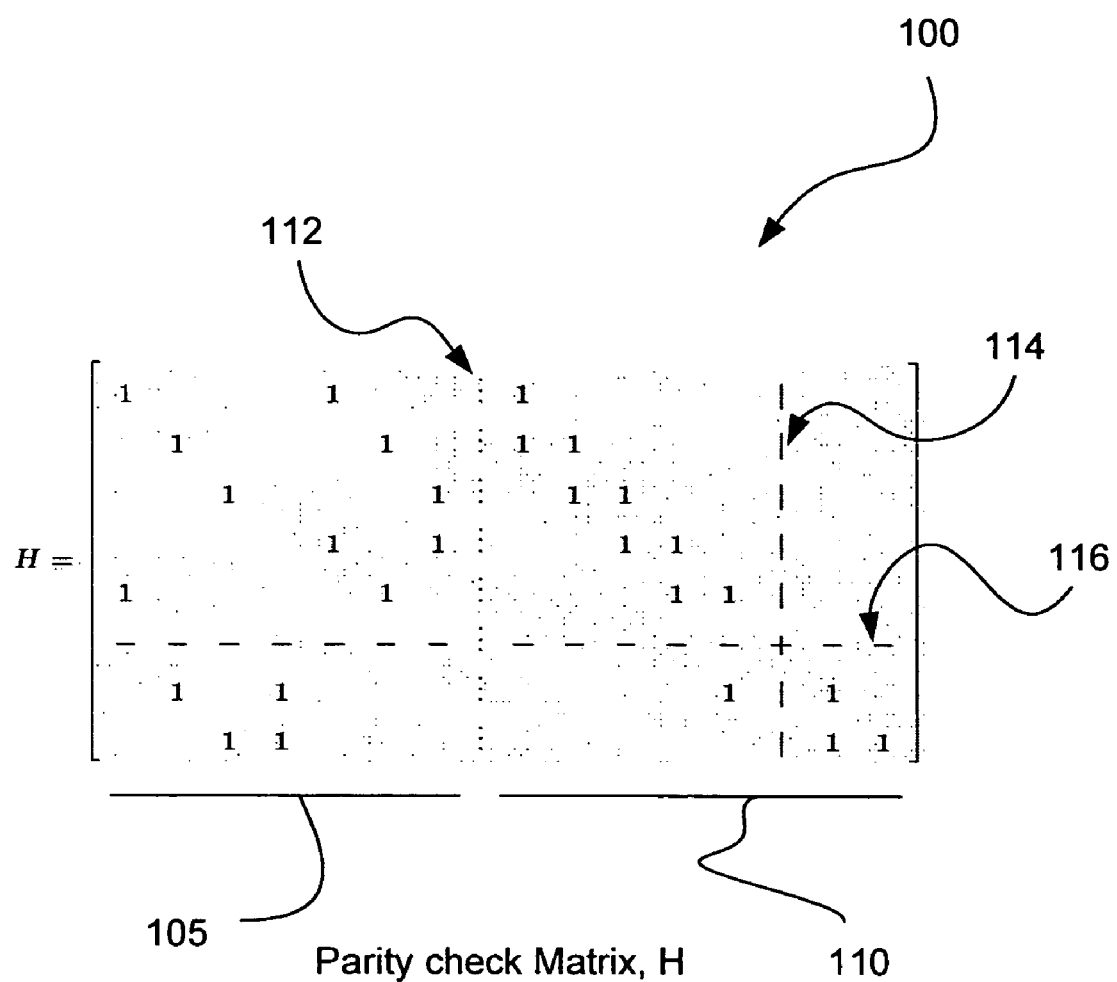
FIG. 1 is an example matrix showing an example parity check relationship for encoding and decoding information according to various embodiments of the present invention.

Turning to FIG. 1 a sample parity check matrix 100 H is shown for a (14, 7) code of total codeword length n=14 and information length k=7. The columns of matrix 100 represent code bits and the rows represent parity check equations. As shown, matrix 100 includes a data bit field 105 left of vertical line 112 and a parity bit field 110 right of vertical line 112.

Conventionally, each LDPC codeword has the same length as others in a block since the block is typically encoded using the same parity check matrix for each codeword. However, according to one embodiment of the present invention, a family of different sized LDPC codes (H matrices) may be used for encoding/decoding different length combinations. For each different size codeword, a corresponding size matrix is used for encoding and decoding. This approach, however, may only be feasible when the number of length combination is relatively small.

Figure 2:
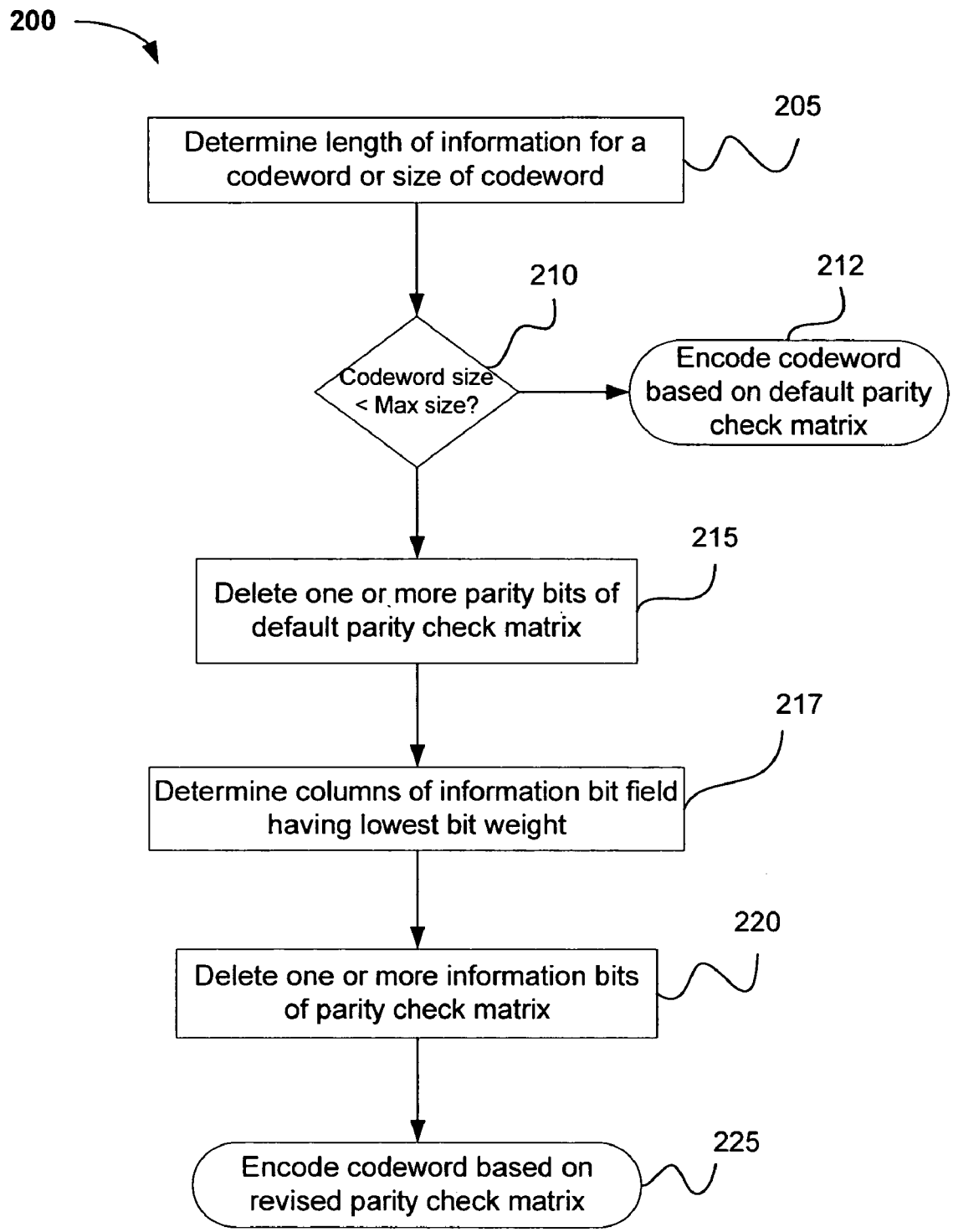
FIG. 2 is a flow diagram illustrating a method for encoding variable length LDPC codewords according to one embodiment of the present invention.

In another approach, turning to FIG. 2, a method 200 for encoding variable length codewords may include determining 205 a length of information to encode in a codeword (and/or determining the size of codeword to be used). If the determined codeword size is less than 210 than a specified size of a default parity check matrix, method 200 may include deleting 215 one or more parity bits of the default matrix or "mother code" to correspond to the size of codeword needed. Method 200 may additionally or alternatively include deleting 220 one or more information bits of the default matrix. A codeword is either encoded 212 based on the default matrix or encoded 225 based on the adjusted matrix.

Determining the size of the codeword may simply involve identifying a length of information to be sent in each codeword. In one example embodiment, for WLAN, each single medium access control (MAC) service data unit (MSDU) (or MAC protocol data unit (MPDU)) covered by a single CRC checksum is preferably encoded as one block code. In other words, the data boundary of an MSDU is respected by the encoder. The MSDU length field indicated in a PLCP header, in this embodiment, is all that is needed for identifying the length of the information to be coded.

The size of the default matrix or "mother code" may be adjusted to accommodate various length combinations by deleting or puncturing code bits. As shown in matrix 100 (FIG. 1), when encoded systematically, the last n-k code bits correspond to parity bits of a codeword and "deleting" or "puncturing" 215 these parity bits is interpreted as erasing these bits in the decoder or setting them as unknown. For a family of low-complexity encodeable parity matrices in the form of H=[$H_1$|P], where H1 is a low density matrix and P is a lower triangular square matrix, deleting x parity bits may be performed by deleting the last x columns and the last x rows of the H matrix 100 (FIG. 1). As shown by dashed lines 114, 116 in FIG. 1, the original (14, 7) mother code is punctured by 2 parity bits into a (12, 7) code.

Deleting information bits 220 (in addition to or in lieu of puncturing 215 parity bits) may be performed by deleting columns in data bit field 105 (FIG. 1). Selection of information bit columns for deletion, however, may impact code performance, particularly when accompanied by parity bit puncturing. As shown in the example of FIG. 1, when the two rows under line 116 are deleted, the fourth column in matrix 100 will no longer have any bits remaining (e.g., no "1s" are present in the fourth column of the resized matrix defined by dashed lines 114 and 116). The fourth column is thus no longer represented by any parity check equations in the resized matrix. Accordingly, since the fourth column is the weakest link in resizing matrix 100, it could be beneficial to delete the fourth column first when deleting information bits.

Generally there are two types of LDPC codes, regular codes and irregular codes. A regular code is represented by a matrix where the column weight for the data bit field is equal for all columns. Conversely, an irregular code is represented by a matrix where column weights may be different from one another. If information bits are to be deleted, method 200 may optionally include identifying or determining 217 one or more of the data bit columns in the mother code having the lowest total bit weight and deleting 220 the one or more columns of the code having the lowest weight. If a regular code is used, the columns may have the same weight unless one or more parity bits are punctured or deleted.

Referring back to FIG. 1, to derive a (9,4) code from the (12,7) code (e.g., the code after the two parity bits are punctured from the default (14, 7) code), the second, third and fourth columns may be deleted since those columns have the lowest column weight (i.e., number of '1's) after parity bit puncturing. In order to implement this option, however, the column weight distribution may have to be obtained or determined on every instance. This distribution however, may vary with the derived code, i.e., the number of rows deleted. In real-time applications, obtaining this distribution for every case and then selecting columns for deletion on-the-fly may be an inefficient time-consuming procedure.

Accordingly, in certain embodiments of the present invention, various thresholds may be set to obtain practically achievable results. For example, assume a mother code of (2000, 1600); that is, the H matrix is of size 400×2000 for maximum code lengths of 2000 bits of which 1600 may be information bits.

Figure 3:
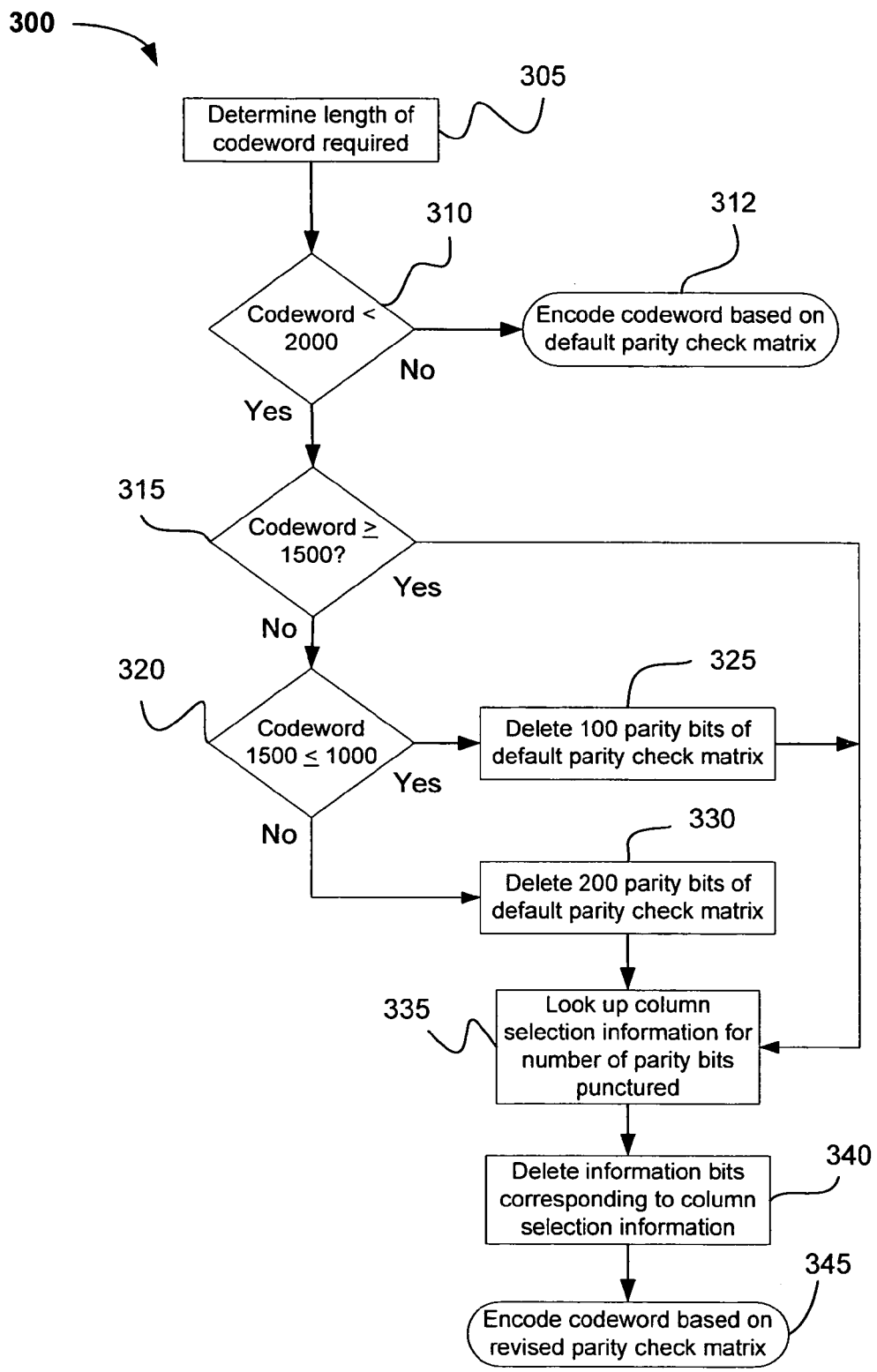
FIG. 3 is a flow diagram illustrating a method for encoding variable length LDPC codewords according to another embodiment of the present invention.

Turning to FIG. 3, a method 300 for encoding may include using threshold values for handling varying codeword lengths, although the inventive embodiments are not limited to any number of threshold values or code lengths. In one example implementation, two thresholds may be set at 1500 and 1000 although it is entirely discretionary. The length of the code is determined 305 and if the code meets the maximum of the mother code (i.e. 2000) the information is encoded 312 using the full size default parity check matrix as previously discussed.

When the desired code length is less than 2000 but above 1500 (315), no parity bits are punctured and only information bits are deleted 340 as necessary to accommodate the codeword size. As discussed previously, one or more columns of information bits may be deleted according to a column weight distribution of bits as desired (e.g., if an irregular code is used with no parity bit puncturing).

In the case of regular codes and no parity bit puncturing, the columns may theoretically have equal weight and thus there may be no need to choose specific information bit columns for deletion since it may not impact code performance. In any event, information for selecting which columns to delete could be previously stored and retrieved 335 such as in a look-up table or other memory.

For code lengths within the thresholds 1000 and 1500 (320), a number of parity bits may be punctured 325, for example 100 parity bits, and information bits can be deleted according to previously stored column selection information for the case when the last 100 rows are to be deleted due to parity bit puncturing.

For code lengths less than 1000 a greater number of parity bits such as 150 or 200 could be punctured 330 and previously stored column selection information for deleting the lowest weighted column(s) of information bits when this many parity bits are punctured can be retrieved 335. The information may then be coded 345 based on the revised parity check matrix. In this manner, only a relatively small amount of information would need to be stored in prior and the complexity of the corresponding encoding system may be reduced while still achieving a reasonable amount of flexibility. Decoding may be performed in a substantially reciprocal manner as that described above using similarly configured algorithms for the decoder.

Figure 4:
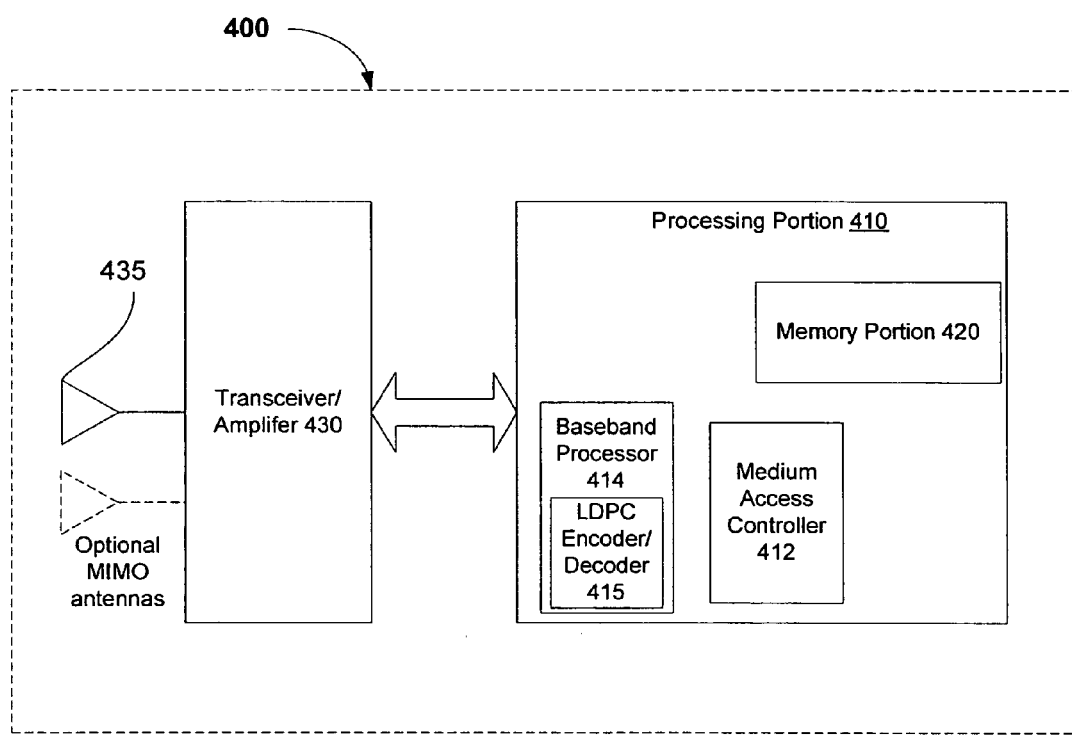
FIG. 4 is block diagram of an example communication device according to various aspects of the present invention.

Turning to FIG. 4, an example communication device 400 using forward error correction (FEC) with variable length LDPC FEC may generally include a code processing portion 410, and a memory portion 420 accessible by processing portion 410. Device 400 may also optionally include a transceiver/amplifier portion 430 and/or one or more antennas 435. In certain example embodiments, coded information is transmitted/received wirelessly using OFDM modulation and demodulation techniques compatible with one or more Institute for Electrical and Electronic Engineers (IEEE) 802.11 standards for wireless local area networks (WLANs), although the inventive embodiments are not limited in this respect. (Note: two antennas are shown in FIG. 4 for optional Multiple Input Multiple Output (MIMO) implementations).

Memory portion 420 may include one or more fixed, removable, internal or external memories and capable of storing machine readable code and/or other data which may be used by processing portion 410, for example to perform one or more of the variable length LDPC encoding/decoding processes described herein. Processing portion 410 and/or memory portion 420 may be any single component or combination of components for performing these functions.

Processing portion 410 may be configured to perform digital communication functions such as a medium access control 412 and/or baseband processing 414. In one example implementation, an LDPC encoder/decoder 415 configured to perform one of the previously described variable length encoding methods is integrated, along with an optional digital demodulator (not separately shown), as part of a digital baseband processor 414. The inventive embodiments are however not limited in this respect. Additional elements, such as one or more analog to digital converters (ADC), digital to analog converters (DAC), a memory controller, a digital modulator and/or other associated elements, may also be included as part of device 400.

In certain embodiments, processing portion 410 and/or memory portion 420 may be implemented using one or more programmable devices such as a microprocessor, Digital Signal Processor (DSP), microcontroller or field programmable gate array. Additionally and/or alternatively, various elements of processing portion 410 may be implemented using discrete circuit components or as one or more application specific integrated circuits (ASICs). Other implementations may also be possible and the principles of the inventive embodiments are not limited to any specific hardware, software or firmware implementation.

Figure 5:
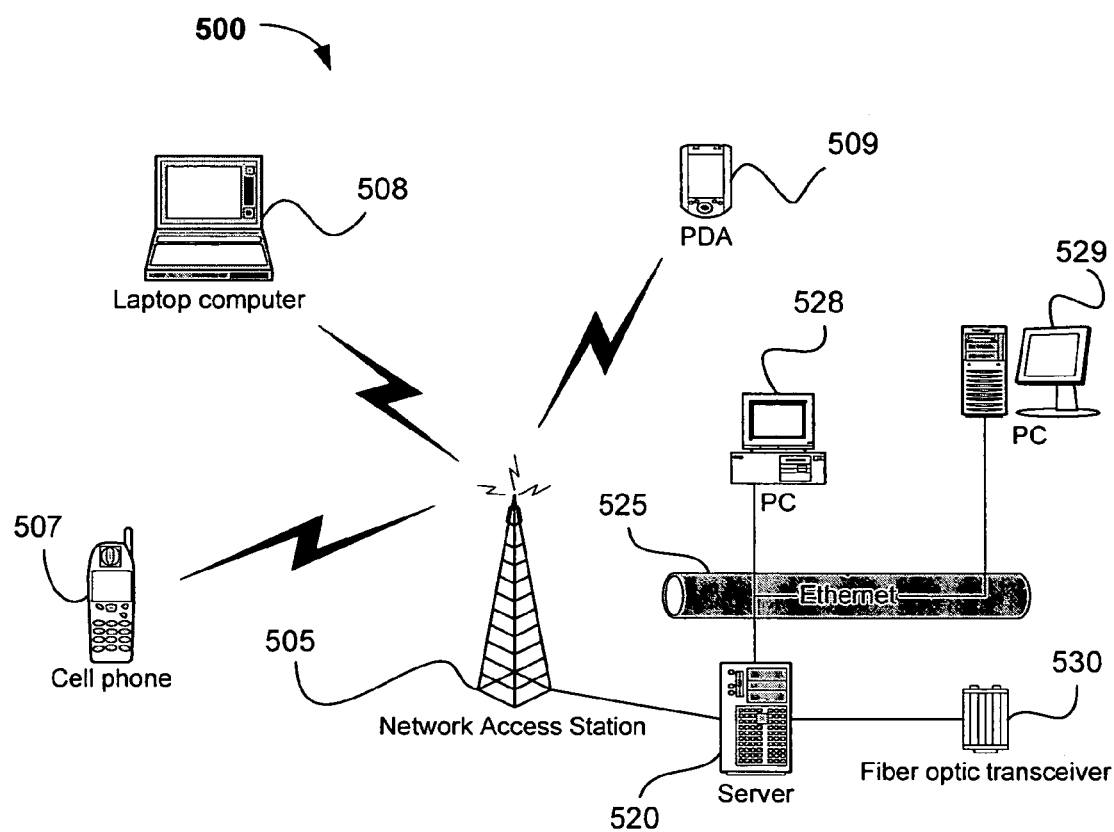
FIG. 5 is a block diagram of an example communication network including a communication device similar to that in FIG. 4.

Referring to FIG. 5, an example communication network 500 using variable length LDPC codes for forward error correction (FEC), and for which the inventive embodiments may be adapted, may include one or more wireless network access stations 505 and one or more wireless user stations 507-509. Wireless network access station 505 may be any device or combination of devices which facilitate network access to wireless user stations 507-509 via electromagnetic waves including for example, a wireless local area network (WLAN) access point (AP), a wireless wide area network (WWAN) AP, a cellular telephone base station and the like. User stations 507-509 may be any device or component of such device configured to communicate with access station 505, including for example, a cellular telephone 507, a laptop computer 508, a personal digital assistant 509 or other communication or computing devices and/or their RF interfaces.

Network access station 505 may include and/or be communicatively coupled to a network processor 520 such as a network server, telephone circuit switch, or any other packet or frame-based network switch and/or information control device. Network 500 may additionally or alternatively include physically connected components such as those used in a wired network (e.g., Ethernet 525 and related user stations 528, 529) or a fiber optic network (e.g., fiber optic transceiver 530). Accordingly, any device in network 500 using FEC may suitably include encoding/decoding components arranged to perform the variable length LDPC coding methods described herein.

Unless contrary to physical possibility, the inventor envision the methods described herein: (i) may be performed in any sequence and/or in any combination; and (ii) the components of respective embodiments combined in any manner.

Although there have been described preferred embodiments of this novel invention, many variations and modifications are possible without departing from the scope of the invention and the embodiments described herein are not limited by the specific disclosure above, but rather should be limited only by the scope of the appended claims and their legal equivalents.

The invention claimed is:

1. A method of encoding information by a wireless communication device, comprising:
   encoding information into one or more variable length low density parity check (LDPC) codewords;
   identifying a length of the information to be sent with the one or more codewords; and
   transmitting the length of the information in a header of a data unit.

2. The method of claim 1 further comprising:
   transmitting the one or more variable length codewords via an air interface using orthogonal frequency division multiplexing (OFDM).

3. The method of claim 1 further comprising:
   sending one or more of the variable length codewords to a network device, wherein the network device comprises a wireless local area network (WLAN) access point (AP).

4. The method of claim 1 further comprising sending one or more of the variable length codewords to a network device.

5. The method of claim 1 wherein encoding information into one or more variable length LDPC codewords comprises:
   selecting a parity check matrix from a plurality of different sized matrices, the selected parity check matrix having a size corresponding to a size of information to be encoded.

6. The method of claim 1 wherein encoding information into one or more variable length LDPC codewords comprises:
   adjusting a size of a default parity check matrix by at least one of puncturing one or more parity bits and deleting one or more information bits.

7. The method of claim 6 wherein deleting one or more information bits comprises:
   deleting one or more columns of the default parity check matrix.

8. The method of claim 7 wherein deleting one or more columns includes selecting the one or more columns having a lowest bit weight.

9. A method of decoding encoded information by a wireless communication device, comprising:
   receiving a data unit including one or more variable length low density parity check (LDPC) codewords from a network device; and
   decoding the one or more variable length LDPC codewords after decoding a length of the information from a header of the data unit.

10. The method of claim 9 wherein decoding the one or more variable length LDPC codewords comprises:
    decoding a codeword based on a parity check matrix having a size corresponding to a length of the codeword.

11. The method of claim 9 wherein decoding the one or more variable length LDPC codewords comprises:
    decoding a codeword based on a parity check matrix having at least one of punctured parity bits and deleted information bits.

12. A wireless communication device, comprising:
    a low density parity check (LDPC) encoder configured to encode information into varying length low density parity check (LDPC) codewords using different sized parity check matrices by identifying a length of the information to be sent with the one or more codewords; and a transmitter to transmit the length of the information in a header of a data unit.

13. The wireless communication device of claim 12 wherein the different sized parity check matrices are selected from a memory based on a length of information to encode in each codeword.

14. The wireless communication device of claim 12 further comprising:
    a low density parity check (LDPC) decoder configured to decode varying length low density parity check (LDPC) codewords of a received block code using different sized parity check matrices.

15. The wireless communication device of claim 12 wherein the different sized parity check matrices are derived from a default matrix by at least one of puncturing one or more parity bits and deleting one or more information bits of the default matrix.

16. The wireless communication device of claim 15 wherein deleting one or more information bits comprises deleting one or more matrix columns have a lowest bit weight.

17. A wireless communication system comprising:
    a mobile unit including, a radio frequency (RF) transceiver, an encoder communicatively coupled to the RF transceiver and adapted to encode information into one or more variable length low density parity check (LDPC) codewords and a medium access controller to generate a medium access control service data unit (MSDU), wherein the MSDU includes a length of information field.

18. The wireless communication system of claim 17 comprises a wireless local area network (WLAN) access point (AP).

19. The wireless communication system of claim 17 further comprising one or more antennas coupled to the RF transceiver.

20. The wireless communication system of claim 17 wherein the encoder is adapted to encode variable length LDPC codewords using a parity check matrix having a size corresponding to a length of information for each codeword.

21. The wireless communication system of claim 20 wherein the parity check matrix is selected from one of a plurality of stored matrices having different sizes.

22. The wireless communication system of claim 20 wherein the size of the parity check matrix is adjusted by at least one of puncturing parity bits and deleting information bits of a default sized parity check matrix.

* * * * *